United States Patent
Ahn

(10) Patent No.: US 7,149,103 B2
(45) Date of Patent: Dec. 12, 2006

(54) SET PROGRAMMING METHODS AND WRITE DRIVER CIRCUITS FOR A PHASE-CHANGE MEMORY ARRAY

(75) Inventor: Su-Jin Ahn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/018,354

(22) Filed: Dec. 22, 2004

(65) Prior Publication Data

US 2005/0141261 A1 Jun. 30, 2005

(30) Foreign Application Priority Data

Dec. 30, 2003 (KR) ............... 10-2003-0100549

(51) Int. Cl.
*G11C 11/56* (2006.01)
(52) U.S. Cl. ..................... 365/148; 365/163
(58) Field of Classification Search ........... 365/148, 365/163, 185.19, 189.09, 189.11
See application file for complete search history.

(56) References Cited

U.S. PATENT DOCUMENTS

| 6,075,719 | A | 6/2000 | Lowrey et al. | |
|---|---|---|---|---|
| 6,750,469 | B1 | 6/2004 | Ichihara et al. | 257/2 |
| 6,885,602 | B1* | 4/2005 | Cho et al. | 365/211 |
| 2004/0228163 | A1* | 11/2004 | Khouri et al. | 365/154 |
| 2004/0246808 | A1* | 12/2004 | Cho et al. | 365/230.06 |

FOREIGN PATENT DOCUMENTS

| JP | 2002-203392 A | 7/2002 |
|---|---|---|
| JP | 2003-100085 A | 4/2003 |

\* cited by examiner

*Primary Examiner*—Tan T. Nguyen
(74) *Attorney, Agent, or Firm*—Harness, Dickey & Pierce, P.L.C.

(57) ABSTRACT

Exemplary embodiments of the present invention provide set programming methods and write driver circuits for a phase-change memory array. An exemplary embodiment of a set programming method may comprise applying a set current pulse to the phase-change cells, which may cause phase-change cells, which may be included within the phase-change memory array, to transition to the set resistance state. Exemplary embodiments of the set programming methods and/or write driver circuits may result in the phase-change cells to transition to the set resistance state.

23 Claims, 4 Drawing Sheets

SET PROGRAMMING METHODS AND WRITE DRIVER CIRCUITS FOR A PHASE-CHANGE MEMORY ARRAY

BACKGROUND OF THE INVENTION

This application claims the priority of Korean Patent Application No. 2003-100549, filed on Dec. 30, 2003, in the Korean Intellectual Property Office, the disclosure of which is incorporated herein in its entirety by reference.

1. Field of the Invention

The present invention relates to set programming methods for a phase-change memory array and write driver circuits which may carry out the set programming method.

2. Description of the Related Art

A PRAM (Phase-change Random Access Memory) is a non-volatile memory device which may store data using a material, for example, GST (Ge—Sb—Te), with a resistance which may vary in response to a phase change of the material which may be caused by a temperature variation. The material may be referred to as a phase-change material.

During a writing operation in a PRAM device, the phase-change material may change state to a crystalline state or an amorphous state when a current may flow through. The transition to the crystalline state or amorphous state of the phase-change material may depend on the intensity and/or quantity of the current flowing through the phase-change material. A larger quantity of current may flow through the phase-change material for a period of time, and the phase-change material may change into the amorphous state, which may be referred to as a reset state. The reset state may correspond to data 1.

A current less than the reset current may flow through the phase-change material for a period of time, and the phase-change material may transform into a crystalline state, which may be referred to as a set state. The set state may correspond to data 0.

The resistance of the phase-change material in the reset state may be greater than the resistance in the set-state. A memory cell may transition from the set state to the reset state by passing a reset current through the phase-change material, which may heat the phase-change material to a temperature greater than a melting temperature and the phase-change material may be cooled (for example, rapidly).

A memory cell may be changed from the reset state into the set state by passing a set current through the phase-change material which may heat the phase-change material to a temperature greater than a crystallization temperature and may be kept in this state for an amount of time and the phase-change material may be cooled.

FIG. 1 is a graph illustrating examples of current pulses for writing data to the phase-change material. Referring to FIG. 1, a larger current pulse with a reduced period may be applied to and may melt the phase-change material. The phase-change material may be cooled (for example, rapidly) and the phase-change material may transform to the amorphous state (for example, reset state). A small current pulse with a long period may be applied to the phase-change material, which may heat the phase change material to a crystallization temperature or higher, to change the phase-change material to a crystalline state (set state).

In a memory array which may include a plurality of phase-change memory cells, the memory cells may include different parasitic loadings according to arrangements in a memory array. Signal lines which may be connected to the memory cells may have different loads. A reset current difference among the memory cells may be generated during a fabrication process as the area of the memory array may increase. The reset current difference may result in a set current difference. Some of the memory cells may not change to the set state with one set current.

For example, some of the memory cells may change to the set state in response to a set current and some of the memory cells may not change to a set state in response to a set current. This may result in the phase-change memory array to malfunction.

SUMMARY OF THE INVENTION

An exemplary embodiment of the present invention may provide a set programming method for a phase-change memory array which may have a plurality of phase-change cells which may transition to a reset resistance state or a set resistance state in response to a current pulse which may be applied thereto. The set programming method may include applying a set current pulse to the phase-change cells which may cause the phase-change cells to transition to a set resistance state. The set current pulse may include first through nth stages in which a magnitude of current may be decreased (for example, gradually).

In exemplary embodiments of the present invention, the magnitude of the set current pulse of the first stage may correspond to a maximum current for a phase-change cell which may transition the phase-change cell to a set resistance state.

In exemplary embodiments of the present invention, the magnitude of the set current pulse of the first stage may not exceed a magnitude of current which may heat the phase-change cells to their melting temperature.

In exemplary embodiments of the present invention, there may be periods between the set current pulse of adjacent stages during which the magnitude of current may be zero and/or the set current pulses of the first through nth stages may be sequentially generated.

In exemplary embodiments of the present invention, n may be four.

Another exemplary embodiment of the present invention may provide a set programming method for a phase-change memory array which may have a plurality of phase-change cells which may transition to a reset resistance state or a set resistance state in response to a current pulse applied thereto. The set programming method may comprise applying a first current pulse with a magnitude to the phase-change cells such that the phase-change cells may transition to the set resistance state and sequentially applying second through nth current pulses, magnitudes of which may be smaller than the magnitude of the first current pulse, to the phase-change cells. The magnitudes of the second through nth current pulses may be sequentially reduced.

In exemplary embodiments of the present invention, the magnitude of current of the first current pulse may be a maximum current which may transition the phase-change memory cells to the set resistance state.

Another exemplary embodiment of the present invention may provide a write driver circuit of a phase-change memory array which may have a plurality of phase-change cells which may transition to a reset resistance state or a set resistance state in response to a current pulse applied thereto. The write driver circuit may comprise a pulse generator and a current controller.

In exemplary embodiments of the present invention, the pulse generator may generate a set voltage pulse which may have first through nth stages in which a magnitude of voltage may be decreased (for example, gradually).

In exemplary embodiments of the present invention, the current controller may apply a set current pulse, which may have the first through nth stages in which a magnitude of current may be decreased (for example, gradually) and may be in response to the set voltage pulse, to the phase-change cells.

In exemplary embodiments of the present invention, the current controller may include a first transistor, a second transistor and a control transistor.

The first transistor may have a first terminal which may be connected to a power supply voltage and a second terminal which may be connected to the gate thereof. The second transistor may have a first terminal which may be connected to the power supply voltage and a second terminal through which the set current pulse may be output. A gate of the second transistor may be connected to the gate of the first transistor.

The control transistor may have a first terminal which may be connected to the second terminal of the first transistor and a second terminal which may be connected to a ground voltage. A degree to which the control transistor may be turned on may be determined by the set voltage pulse which may be applied to the gate thereof.

In exemplary embodiments of the present invention, the magnitude of the set voltage pulse of the first stage may correspond to a maximum magnitude which may transition the phase-change memory cells to a set resistance state.

In exemplary embodiments of the present invention, the magnitude of the set voltage pulse of the first stage may not exceed a voltage which may generate a set current pulse and may heat the phase-change cells to their melting temperature.

In exemplary embodiments of the present invention, there may be periods between the set voltage pulse of adjacent stages during which the magnitude of voltage may be zero and/or the set voltage pulse of the first to nth stages may be sequentially generated.

In exemplary embodiments of the present invention, n may be four.

Another exemplary embodiment of the present invention may provide a current controller which may comprise a first transistor which may have a first terminal connected to a power supply voltage and a second terminal connected to the gate of the first transistor, a second transistor which may have a first terminal connected to the power supply voltage and a second terminal adapted to output the set current pulse, and a gate connected to the gate of the first transistor, and a control transistor which may have a first terminal connected to the second terminal of the first transistor and a second terminal connected to a ground voltage. The function of the control transistor may be determined by at least the set voltage pulse which may be applied to the gate of the control transistor.

Another exemplary embodiment of the present invention may provide a write driver circuit which may be adapted to generate a plurality of set current pulses in response to a plurality of set voltage pulses during a plurality of stages. The magnitude of the set voltage pulses and set current pulses may decrease (for example, gradually), and the set current pulses may be applied to a plurality of phase-change memory cells such that the plurality of phase-change cells may transition to a set state.

BRIEF DESCRIPTION OF THE DRAWINGS

Exemplary embodiments of the present invention will become more apparent with reference to the attached drawings in which.

Figure 1:
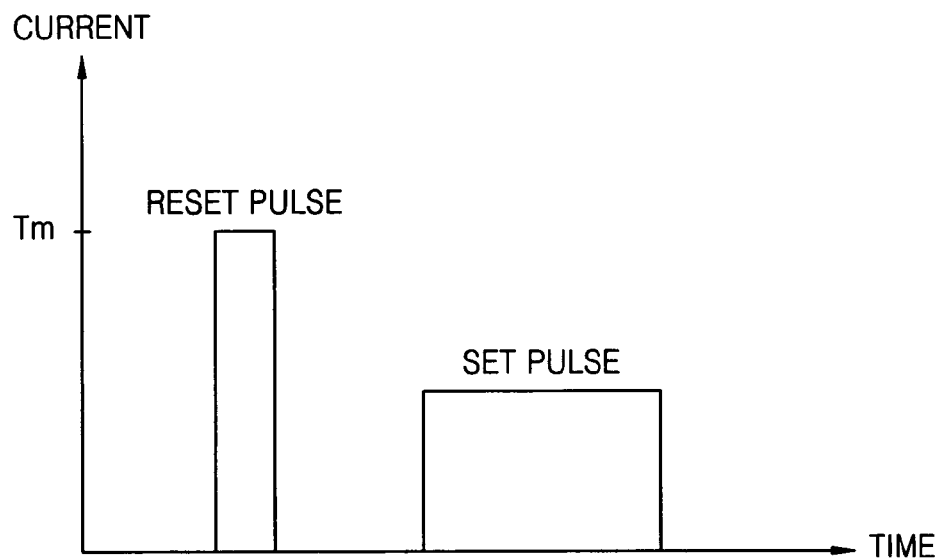
FIG. 1 is a graph illustrating examples of current pulses for writing data to a phase-change material.

DETAILED DESCRIPTION OF EXEMPLARY
EMBODIMENTS OF THE PRESENT
INVENTION

Exemplary embodiments of the present invention will now be described with reference to the accompanying drawings. The present invention may, however, be embodied in many different forms and should not be construed as being limited to the embodiments set forth herein; rather, these exemplary embodiments are provided so that this disclosure will be thorough and complete, and will fully convey the concept of the invention to those skilled in the art. Throughout the drawings, like reference numerals refer to like elements.

Figure 2:
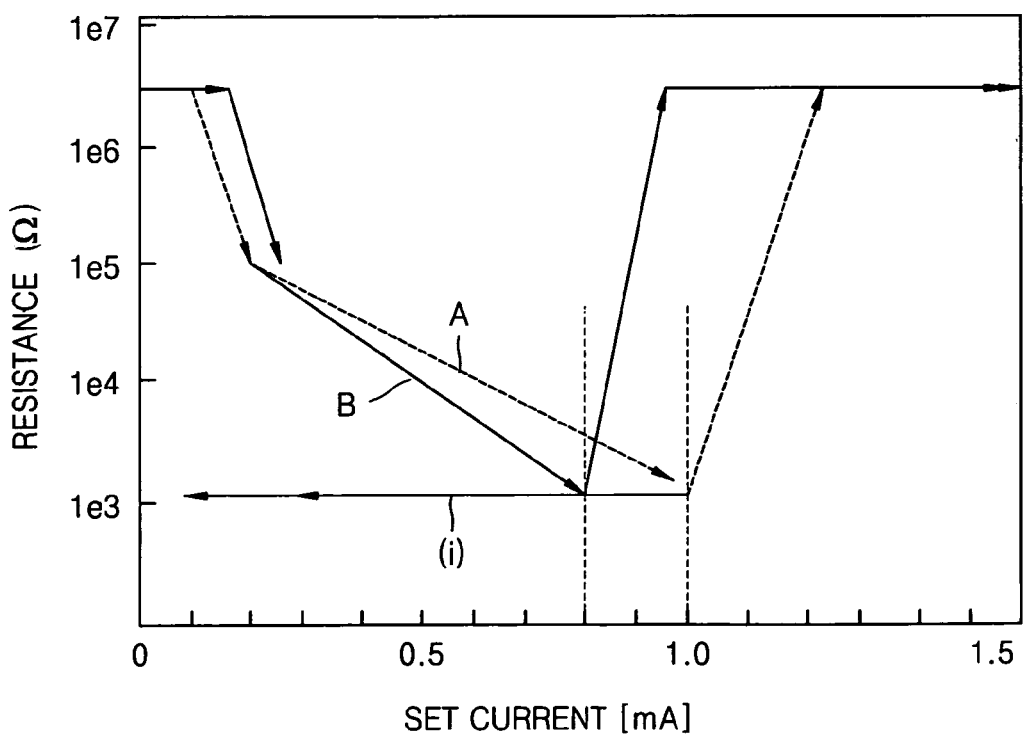
FIG. 2 is a graph illustrating examples of variations in the resistances of phase-change memory cells according to variations in current applied to the phase-change memory cells.

FIG. 2 is a graph illustrating examples of variations in the resistances of phase-change memory cells according to a variation in current applied to the phase-change memory cells. FIG. 2 illustrates an example of memory cells A and B among memory cells of a phase-change memory array.

Referring to FIG. 2, the resistance of the memory cell A may decrease when current applied thereto may increase and/or may reach a substantially reduced (for example, a minimum) value when the current applied thereto may be approximately 1 mA. The current applied to the memory cell A may exceed 1 mA and the resistance of the memory cell A may increase (for example, gradually) to a substantially greater (for example, maximum) value when the current may reach 1.2 mA or greater. The resistance may reach a saturation state and the resistance may not further increase.

The current applied to the memory cell A may be reduced when the resistance of the memory cell A may have a substantially high (for example, a maximum) value, and the resistance of the memory cell A may decrease. The current applied to the memory cell A may reach less than 1 mA and the resistance of the memory cell A may maintain a value. The resistance of the memory cell A may maintain a substantially reduced value (for example, a minimum), as indicated by line (i) in FIG. 2, when the current may be less than 1 mA.

The current applied thereto may be 1 mA and the state of the memory cell A may be a set resistance state, the memory cell A may remain in the set resistance state when the current applied thereto may increase and/or decrease.

The resistance of the memory cell B may reach a reduced, or substantially reduced, (for example, a minimum) value when the current applied thereto may be approximately 0.8 mA. The resistance of the memory cell B may reach a larger, or substantially larger, (for example, a maximum) value when the current applied thereto may be greater than or equal to 0.9 mA.

The resistance of the memory cell B may have a larger, or substantially larger, (for example, a maximum) value, the current applied to the memory cell B may be reduced and the resistance of the memory cell B may decrease. The current applied to the memory cell B may be less than or equal to 0.8 mA and the resistance of the memory cell B may maintain a value. The resistance of the memory cell B may maintain a value, as indicated by the line (i) in FIG. 2, and the current may be reduced to less than or equal to 0.8 mA.

The current applied thereto may be 0.8 mA and the memory cell B may be in a set resistance state. The memory cell B may remain in the set resistance state and the current applied thereto may be increased and/or decreased.

As illustrated in FIG. 2, the currents at which the memory cells A and B may transition to a set resistance state may differ. FIG. 2 shows only two memory cells A and B, a plurality of memory cells of the phase-change memory array may require different currents to transition to the set resistance state.

In exemplary embodiments of the present invention a quantity of current may be applied to the memory cells, and the current which may allow the memory cells maintain the set resistance state may be reduced.

The memory cells of the phase-change memory array may transition to a set resistance state when the set current may be applied to the memory cells, at least once, but possibly several times, and the applied current may be decreased (for example, gradually).

Figure 3A:
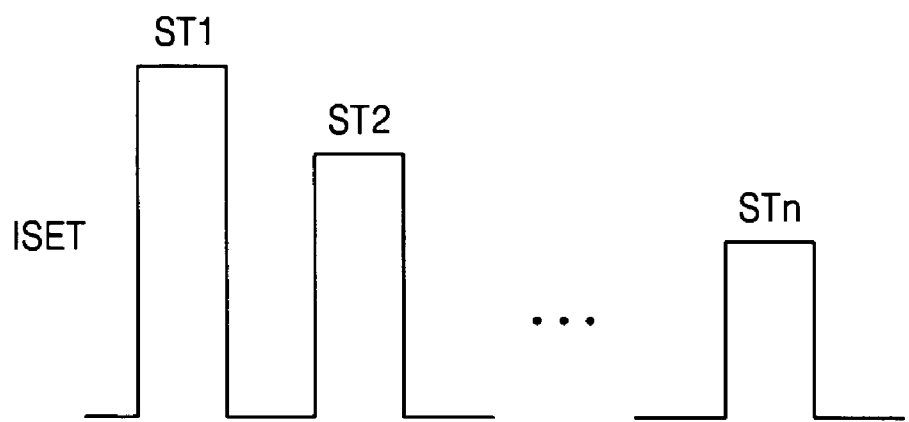
FIG. 3A illustrates set current pulses applied to a phase-change memory array in a set programming method according to an exemplary embodiment of the present invention.
Figure 3B:
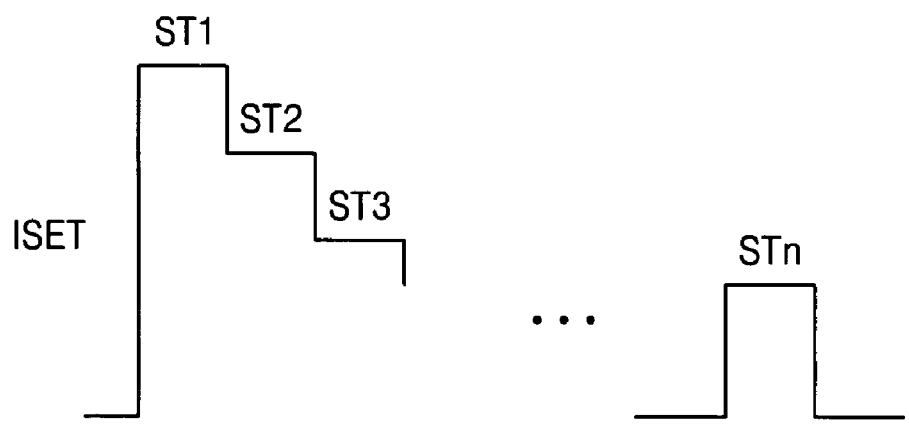
FIG. 3B illustrates set current pulses applied to the phase-change memory array in a set programming method according to another exemplary embodiment of the present invention.

FIG. 3A illustrates set current pulses which may be applied to the phase-change memory array in a set programming method according to an exemplary embodiment of the present invention and FIG. 3B illustrates set current pulses which may be applied to the phase-change memory array in a set programming method according to another exemplary embodiment of the present invention.

In an exemplary embodiment of the set programming method, a set current pulse ISET may be applied to phase-change cells such that the phase-change cells may be in a set resistance state. The set current pulse ISET may be changed and the current may be decreased (for example, gradually).

Referring to FIG. 3A, in ST1, the set current pulse ISET may have a larger, or substantially larger, (for example, a maximum) magnitude, and in STn, the set current pulse ISET may have a lower, or substantially lower, magnitude (for example, a minimum). The magnitude of the set current pulse of the ST1 may ensure that a phase-change cell may have a larger magnitude of current transitions to a set resistance state. ST1 through STn, and all which may be included, for example, ST2, ST3, etc., may be referred to as stages, for example, a first stage, a second stage, a third stage, an nth stage, etc.

The memory cell A of FIG. 2, which may be a phase-change memory cell, may have a larger, or substantially larger, magnitude (for example, a maximum magnitude) and may transition to a set resistance state. The magnitude of the set current pulse ISET at ST1 may be 1 mA. The magnitude of the set current pulse ISET may depend on the memory cells of the memory array, the magnitude of the set current pulse ISET at ST1 may not be greater than, or equal to, the magnitude which may heat the phase-change cells to a temperature which may cause melting.

The phase-change cells may be heated to a temperature greater than a temperature which may cause melting and the phase-change cells may transition to a reset resistance state. The magnitude of the set current pulse ISET at ST1 (for example, the maximum magnitude of the set current pulse ISET) may be less than or equal to the current magnitude which may heat the phase-change cells to a temperature which may cause melting.

The set current pulse ISET may be applied to the phase-change memory array which may have multiple forms, examples of which are illustrated in FIGS. 3A and 3B. The set current pulse ISET of FIG. 3A may have a period or periods between states (for example, neighboring states) where the magnitude of current may be small, or substantially small (for example, zero current). There may be a single or plurality of set current pulses ISET in FIG. 3A with periods during which current may not be applied to the phase-change memory between the set current pulses ISET. The set current pulse ISET at ST1 may be followed by a period with a small, or substantially small, (for example, zero current) which may be followed by the set current pulse ISET at ST2, and so on.

The set current pulse ISET may be applied as shown in FIG. 3B. A set current pulse ISET at ST1 and another set current pulse ISET at ST2 may be applied to the phase-change memory array. The set current pulses ISET at ST1 through STn may be applied (for example, sequentially) to the phase-change memory array and there may not be a period with a small, or substantially small, voltage (for example, zero voltage). The set current pulse ISET of FIG. 3B may have the same, or substantially the same, shape as a step form wave.

The set current pulses ISET ST1 through STn may have a rectangular waveform in FIGS. 3A and 3B.

The set current pulse ISET may have a plurality of stages. The number of stages which may allow for the phase-change cells to transition to the set resistance state may be determined by the size of the phase-change memory array and/or the magnitude of the set current pulse ISET of ST1. When n is equal to four, the set current pulse ISET may be at ST1, ST2, ST3 and/or ST4. This may be the number of stages for the cells of the phase-change memory array to transition to a set resistance state.

In another exemplary embodiment of the set programming method, a first current pulse may be applied to the phase-change material such that the phase-change cells may transition to a set resistance state. The phase-change cells may transmit (e.g., sequentially) second through nth current pulses, which may have magnitudes less than or equal to the magnitude of the first current pulse to the phase-change cells. The current magnitudes of the second to nth current pulses may be decreased (e.g., sequentially decreased).

In another exemplary embodiment of the set programming, the first through nth current pulses may be the same, or substantially the same, to the examples of the set current pulse of ST1 through STn as illustrated in FIGS. 3A and 3B.

The exemplary embodiment of the set programming method may apply (e.g., sequentially apply) the set current pulses of ST1 through STn, as illustrated in FIGS. 3A and 3B, to the phase-change memory array.

Figure 4:
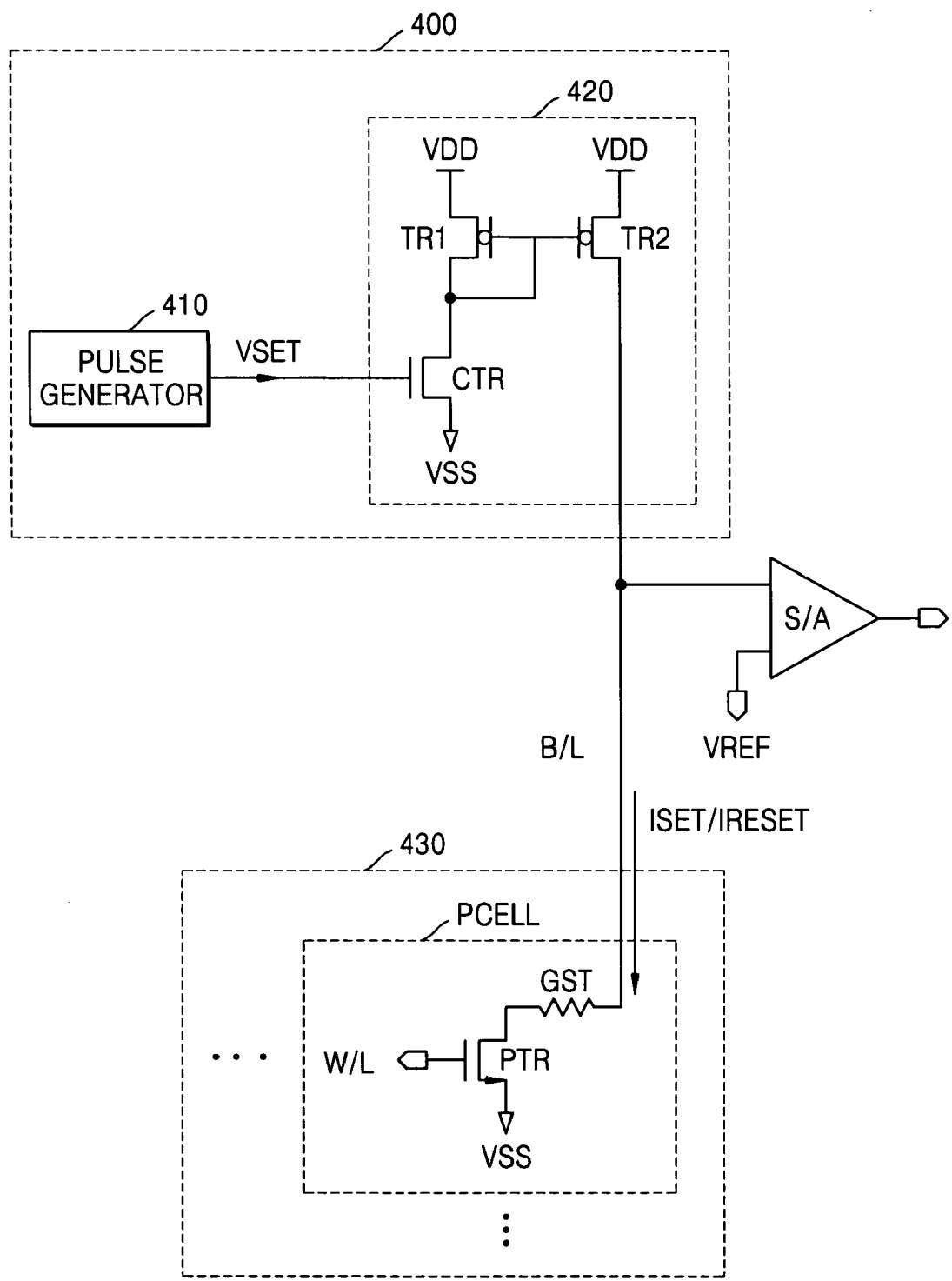
FIG. 4 is a schematic diagram of a write driver circuit according to another exemplary embodiment of the present invention.
Figure 5A:
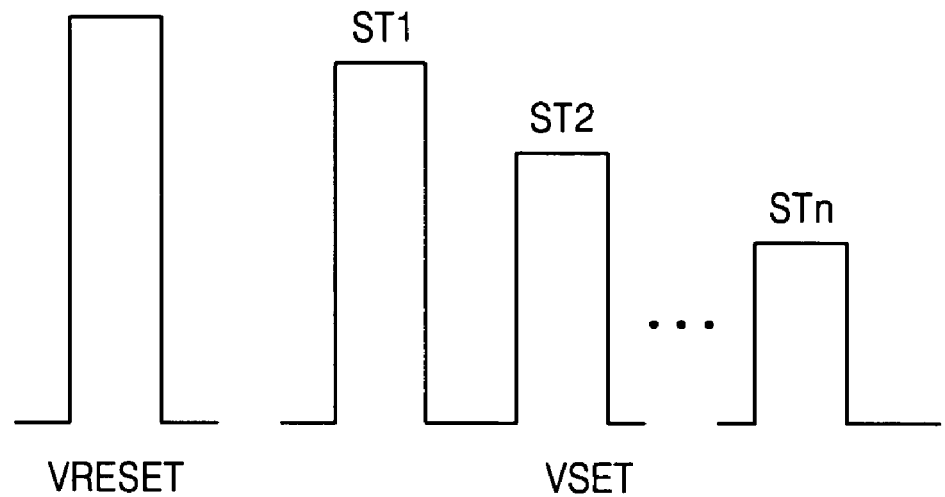
FIG. 5A illustrates a first set voltage pulse generated by the pulse generator of FIG. 4.
Figure 5B:
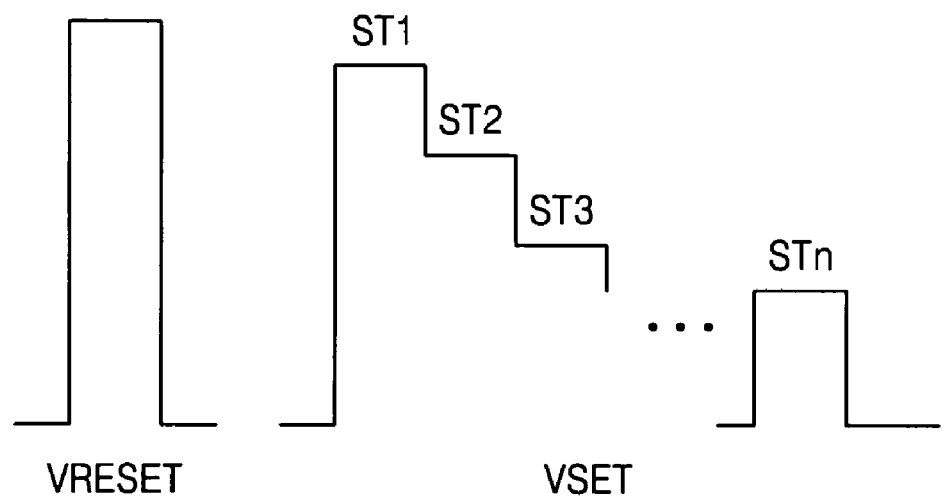
FIG. 5B illustrates a second set voltage pulse generated by the pulse generator of FIG. 4.

FIG. 4 is a schematic diagram of an exemplary embodiment of a write driver circuit 400. FIG. 5A illustrates a first set voltage pulse which may be generated by the pulse generator of FIG. 4, and FIG. 5B illustrates a second set voltage pulse which may be generated by the pulse generator of FIG. 4.

The write driver circuit 400 may include a pulse generator 410 and a current controller 420. The pulse generator 410 may generate set voltage pulses VSET at ST1 through STn in which the magnitude of voltage may be decreased (e.g., gradually decreased). The current controller 420 may apply the set current pulses ISET at ST1 through STn, in which the magnitude of current may be reduced (e.g., gradually reduced) in response to the set voltage pulse VSET, to phase-change cells PCELL.

FIG. 4 shows one of the phase-change cells PCELL. The phase-change cell PCELL may include a transistor PTR connected to a wordline W/L which may be turned on or off, and a phase-change material GST whose resistance may vary according to the set current pulse ISET and/or a reset current pulse IRESET which may be applied thereto.

The write driver circuit 400 of FIG. 4 may carry out an exemplary embodiment of the set programming method as described above. The write driver circuit 400 may apply the set current pulse ISET to the phase-change cells PCELL of the phase-change memory array 430 and the phase-change cells PCELL may transition to the set resistance state. Examples of the set current pulse ISET may be illustrated in FIGS. 3A and 3B and may have the same, or substantially the same, characteristics as described above. The set current pulse ISET may include ST1 to STn in which the magnitude of current may be decreased (e.g., gradually decreased).

The pulse generator 410 may generate the set voltage pulse VSET which may have a voltage waveform as illustrated in FIG. 5A or 5B which may cause the write driver circuit 400 to create an exemplary embodiment of the set current pulse ISET as illustrated in FIG. 3A or 3B. An exemplary embodiment of the reset voltage pulse VRESET, which may be generated by the pulse generator 410, may be illustrated in FIG. 5A. The pulse generator 410 may generate the reset voltage pulse VRESET and the write driver circuit 400 may output a reset current IRESET to the phase-change cells PCELL of the phase-change memory array. The set voltage pulse VSET, which may be generated by the pulse generator 410, may be illustrated in FIG. 5B and may have the same, or substantially the same, form as the set current pulse ISET illustrated in FIG. 3A. The set voltage pulses VSET, may have a section where the magnitude of the voltage may be small, or substantially small, (for example, zero).

The set voltage pulse VSET as illustrated in FIG. 5B may have the same, or substantially the same, form as the exemplary embodiment of the set current pulse ISET shown in FIG. 3B. ST1 to STn of the set voltage pulse VSET may be generated (e.g., sequentially generated).

The current controller 420 may generate a set current pulse ISET which may have the waveform with a shape similar (or substantially similar) to the set voltage pulse VSET, which may be generated by the pulse generator 410. The form of the set current pulse ISET which may be applied to the phase-change cells PCELL of the phase-change memory array 430 may be controlled by the form of the set voltage pulse VSET, which may be generated by the pulse generator 410.

The structure of the pulse generator 410 which may generate the set voltage pulse VSET as illustrated in FIGS. 5A and 5B may be understood by those of ordinary skill so a detailed explanation may be omitted.

The magnitude of the set voltage pulse VSET at ST1 may be generated by the pulse generator 410. The voltage magnitude of the set voltage pulse VSET may correspond to a voltage magnitude which may generate a set current pulse ISET. The set current pulse ISET may have a current magnitude (for example, a maximum current magnitude) which may allow the phase-change cell to transition to a set resistance state. The magnitude of the set voltage pulse VSET at ST1 may not be greater than, or equal to, a voltage which may generate the set current pulse ISET. The set current pulse ISET may heat the phase-change cells PCELL to a temperature, which may cause melting.

The set voltage pulse VSET may have a plurality of stages (for example, ST1 through STn). The number of stages which may transition the phase-change cells PCELL to a set resistance state may be determined by the size of the phase-change memory array 430 and/or the magnitude of the set voltage pulse VSET at ST1. Similar to the set current pulse ISET, n may equal four and the set voltage pulse VSET may include ST1, ST2, ST3 and ST4. ST1, ST2, ST3, and ST4 may transition the cells of the phase-change memory array 430 to the set resistance state.

The current controller 420 may include transistors TR1 and TR2 and a control transistor CTR. Transistor TR1 may have a terminal connected to a power supply voltage VDD and another terminal connected to its gate. Transistor TR2 may have a terminal connected to the voltage VDD (for example, a power supply voltage) and another terminal through which the set current pulse ISET may be output. The gate of the transistor TR2 may be connected to the gate of the transistor TR1. The transistors TR1 and TR2 may be a current mirror.

The control transistor CTR may have a terminal connected with a terminal of the transistor TR1 and another terminal connected to a voltage $V_{SS}$ (for example, ground). The degree to which the control transistor CTR may be turned on may be determined by the set voltage pulse VSET which may be applied to the gate of the control transistor CTR. The degree to which the control transistor CRT may be turned on when the set voltage pulse VSET at ST1 may be applied to the gate of the control transistor CTR may be greater than, or equal to, the set voltage pulse VSET at STn may be applied.

The magnitude of current flowing through the control transistor CTR when the set voltage pulse VSET at ST1 may be applied to the gate of the control transistor CTR may be greater than, or equal to, the magnitude of current which may flow through the control transistor CTR when the set voltage pulse VSET at STn may be applied.

The magnitude of the set current pulse ISET, which may be transmitted to a terminal of the transistor TR2, may be proportional to the current which may flow through the control transistor CTR. The magnitude of the set current pulse ISET which may be transmitted to the phase-change memory array 430 may be proportional to the magnitude of the set voltage pulse VSET which may be applied to the control transistor CTR. The write driver circuit 400 may control the magnitude of the set voltage pulse VSET, which may be generated by the pulse generator 410, and may determine the magnitude of current of the set current pulse ISET which may be transmitted to the phase-change memory array 430.

The phase-change cells PCELL of the phase-change memory array 430 may transition to the set resistance state by decreasing (for example, gradually decreasing) the magnitude of the set current pulse ISET which may be transmitted to the phase-change memory array 430 through the write driver circuit 400 of FIG. 4.

As described above, in the set programming method and write driver circuit according to exemplary embodiments of the present invention, the phase-change cells of a phase-change memory array may transition to the set resistance state by transmitting a plurality of set current pulses to the phase-change memory array, which may decrease (for example, gradually decrease) the magnitude of the set current pulses.

Although exemplary embodiments of the present invention have been described as utilizing a gradual decrease in current and/or voltage pulses which may resemble a step form and/or rectangular wave, it will be understood that any suitable variation in magnitude suitable to transition the phase-change memory cells within a phase-change memory array may be utilized as desired by one of ordinary skill in the art.

Although exemplary embodiments of the present invention have been described in conjunction with PRAM (Phase-change Random Access Memory), including, for example, GST (Ge—Sb—Te), it will be understood that exemplary embodiments of the present invention may be utilized in conjunction with any suitable memory created from any suitable material as desired by one of ordinary skill in the art.

Although exemplary embodiments of the present invention have been described based upon a variation in the magnitude of current pulses applied, it will be understood that variations in duration of current pulses may also be utilized to effect phase-change memory cells and/or arrays in the same, or substantially the same, manner as desired by one of ordinary skill in the art.

Although exemplary embodiments of the present invention have been described as being implemented in a circuit as illustrated in FIG. 4, it will be understood that any suitable circuit may be utilized as desired by one of ordinary skill in the art.

Although exemplary embodiments of the present invention have been described as transitioning phase-change memory cells from a reset state to a set state, it will be understood that exemplary embodiments of the present invention may also be utilized to transition phase-change memory cells from a reset state to a set state, as desired by one of ordinary skill in the art. Further, it will be understood that exemplary embodiments of the present invention may be utilized to transition any memory cell and/or array from one state to another state, as desired by one of ordinary skill in the art.

Although exemplary embodiments have been discussed above with regard to a set state corresponding to data zero and a reset state corresponding to data one, it will be understood that any state may correspond to any data value as desired by one of ordinary skill in the art.

Although the scope of the present invention is not limited in this respect, the exemplary embodiments of PRAM discussed above may be memory arrays comprising a plurality of memory cells that may include a phase change memory material such as, for example, a chalcogenide material that may be programmed into different memory states to store data. This material may be, for example, a chalcogenide alloy that exhibits a reversible structural phase change from an amorphous state to a crystalline or a polycrystalline state. Due to the reversible structure, the phase change material may change from the amorphous state to the crystalline state and may revert back to the amorphous state thereafter, or vice versa, in response to temperature changes.

Exemplary embodiments of PRAM discussed above may be used as binary cells (amorphous or crystalline) or multilevel cells (for example, amorphous, substantially amorphous, crystalline, and substantially crystalline).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A set programming method for a phase-change memory array having a plurality of phase-change cells that transition to a reset resistance state or a set resistance state in response to a current pulse applied thereto, comprising:
    transitioning phase-change cells to the set resistance state as a result of applying a set current pulse to the phase-change cells; wherein
        the set current pulse is generated based on a set voltage pulse having a plurality of stages in which a magnitude of voltage is gradually decreased, and
        the set current pulse includes a plurality of stages in which a magnitude of the set current pulse is gradually decreased.

2. The set programming method of claim 1, wherein the plurality of stages of the set current pulse and the set voltage pulse each include at least a first through an nth stages, where n is greater than or equal to two.

3. The set programming method as claimed in claim 2, wherein the magnitude of the set current pulse of the first stage corresponds to a maximum current for transitioning a phase-change cell to the set resistance state.

4. The set programming method as claimed in claim 2, wherein the magnitude of the set current pulse of the first stage does not exceed a magnitude of current for heating the phase-change cells to their melting temperature.

5. The set programming method as claimed in claim 1, further including stages during which the magnitude of the set current pulse is zero.

6. The set programming method as claimed in claim 1, wherein the set current pulse of the plurality of stages are sequentially generated.

7. The set programming method as claimed in claim 1, wherein the plurality of stages of the set current pulse includes four stages.

8. A write driver circuit implementing the set programming method of claim 1.

9. A set programming method for a phase-change memory array having a plurality of phase-change cells that transition to a reset resistance state or a set resistance state in response to a current pulse applied thereto, comprising:
    applying a first current pulse with a magnitude to the phase-change cells such that the phase-change cells transition to the set resistance state; and
    applying, sequentially, n additional current pulses, where n is greater than or equal to one, magnitudes of which are smaller than the magnitude of the first current pulse, to the phase-change cells; wherein
        the set current pulses are generated based on a set voltage pulse having first through nth stages, where n is greater than or equal to two and in which a magnitude of voltage is gradually decreased, and
        the magnitudes of the second through nth current pulses are sequentially reduced.

10. The set programming method as claimed in claim 9, wherein the magnitude of current of the first current pulse corresponds to a maximum current for transitioning a phase-change cell to the set resistance state.

11. The set programming method as claimed in claim 9, wherein the magnitude of the first current pulse does not exceed a magnitude of current for heating the phase-change cells to their melting temperature.

12. The set programming method as claimed in claim 9, further including stages during which the magnitude of the set current pulse is zero.

13. The set programming method as claimed in claim 9, wherein the first through nth current pulses are sequentially generated.

14. The set programming method as claimed in claim 8, wherein the plurality of stages of the set current pulse includes four stages.

15. A write driver circuit implementing the set programming method of claim 9.

16. A write driver circuit of a phase-change memory array having a plurality of phase-change cells that transition to a reset resistance state or a set resistance state in response to a current pulse applied thereto, the write driver circuit comprising:
 a pulse generator adapted to generate a set voltage pulse having first through nth stages, where n is greater than or equal to two, in which a magnitude of voltage is gradually decreased; and
 a current controller adapted to apply a set current pulse to the phase-change cells, wherein the set current pulse has a first through nth stages, where n is greater than or equal to two, in which a magnitude of current is gradually decreased based upon the set voltage pulse.

17. The write driver circuit as claimed in claim 16, wherein the current controller includes:
 a first transistor having a first terminal connected to a power supply voltage and a second terminal connected to the gate thereof;
 a second transistor having a first terminal connected to the power supply voltage, a second terminal through which the set current pulse is output, and a gate connected to the gate of the first transistor; and
 a control transistor having a first terminal connected to the second terminal of the first transistor and a second terminal connected to a ground voltage, wherein a degree to which the control transistor is turned on is determined by the set voltage pulse applied to the gate thereof.

18. The write driver circuit as claimed in claim 16, wherein the magnitude of the set voltage pulse of the first stage corresponds to a maximum voltage for a phase-change cell that requires a maximum current to transition to the set resistance state.

19. The write driver circuit as claimed in claim 16, wherein the magnitude of the set voltage pulse of the first stage does not exceed a voltage required to generate a set current pulse for heating the phase-change cells to their melting temperature.

20. The write driver circuit as claimed in claim 16, further including stages during which the magnitude of the set current pulse is zero.

21. The write driver circuit as claimed in claim 16, wherein the set voltage pulses of the first to nth stages are sequentially generated.

22. The write driver circuit as claimed in claim 16, wherein n is four.

23. A write driver circuit adapted to generate a plurality of set current pulses in response to a plurality of set voltage pulses during a plurality of stages wherein the magnitude of the set voltage pulses and set current pulses gradually decrease, and the set current pulses are applied to a plurality of phase-change memory cells such that the plurality of phase-change cells transition to a set state.

* * * * *